United States Patent [19]
Frindle et al.

[11] Patent Number: 5,923,767
[45] Date of Patent: Jul. 13, 1999

[54] DIGITAL AUDIO PROCESSING

[75] Inventors: Paul Anthony Frindle, Witney; Peter Charles Eastty, Oxford, both of United Kingdom

[73] Assignees: Sony Corporation, Tokyo, Japan; Sony United Kingdom Limited, Weybridge, United Kingdom

[21] Appl. No.: 08/801,355

[22] Filed: Feb. 19, 1997

[30] Foreign Application Priority Data

Mar. 8, 1996 [GB] United Kingdom .................... 9605004
May 10, 1996 [GB] United Kingdom .................... 9609774

[51] Int. Cl.⁶ ...................................................... H03G 7/00
[52] U.S. Cl. .......................... 381/106; 381/102; 381/104; 381/107
[58] Field of Search .................................... 381/102, 104, 381/106, 107

[56] References Cited

U.S. PATENT DOCUMENTS

| | | | |
|---|---|---|---|
| 4,106,054 | 8/1978 | Tzakis | 358/27 |
| 4,562,591 | 12/1985 | Stikvoort . | |
| 4,730,165 | 3/1988 | Nishino et al. . | |
| 5,396,562 | 3/1995 | Ishimitsu et al. . | |
| 5,444,788 | 8/1995 | Orban | 381/106 |

FOREIGN PATENT DOCUMENTS 2 147 165  5/1985  United Kingdom .

*Primary Examiner*—Curtis A. Kuntz
*Assistant Examiner*—Duc Nguyen
*Attorney, Agent, or Firm*—Frommer Lawrence & Haug, LLP.; William S. Frommer; Dennis S. Smid

[57] ABSTRACT

Digital audio processing apparatus comprises: device for detecting the magnitude of an input digital audio signal; and a variable gain element for applying a gain to the input digital audio signal dependent on the detected magnitude of the input digital audio signal, in which:

(i) the applied gain is linearly related to the envelope signal with a first predetermined slope, for detected magnitudes below a first threshold magnitude;

(ii) the applied gain is linearly related to the envelope signal with a second predetermined slope, for detected magnitudes above a second threshold magnitude higher than the first threshold magnitude; and (iii) for detected magnitudes from the first threshold magnitude to the second threshold magnitude, the slope of the applied gain with respect to detected magnitude varies monotonically from the first predetermined slope to the second predetermined slope.

5 Claims, 4 Drawing Sheets

DIGITAL AUDIO PROCESSING

BACKGROUND OF THE INVENTION

1. Field of the Invention

This invention relates to the processing of digital audio signals.

2. Description of the Prior Art

In many modern audio signal processing devices, such as audio mixing consoles, audio processing operations which had previously been carried out in the analogue domain are now performed on sampled digital audio signals.

An example of this is the "dynamics" section of a digital audio mixing console. Dynamics processing refers to a family of processing techniques generally having a non-linear effect on the audio signal (compared with the substantially linear techniques of simple gain adjustment and additive mixing). In general, effects classified as "dynamics" tend to have a distorting effect on the sound represented by the audio signal, albeit often a pleasing or useful distortion. For example, the gain applied to an audio signal might be non-linearly adjusted (or "compressed") so that the audio signal has a more constant level - alleviating the level variations which might result as a performer moves towards and away from a microphone.

FIG. 1 of the accompanying drawings schematically illustrates such a processor in which an input digital audio signal (for example, a digital audio signal sampled at a 48 kHz sampling rate to 16 bit resolution) is supplied in parallel to a multiplier 10 and to a processing chain 20.

The processing chain 20 comprises a peak (or envelope) detector 30, a logarithmic (linear to decibel) converter 40, a dynamics processing element 50, a control circuit 60, and a logarithmic (decibel to linear) converter 70.

The output of the logarithmic converter 70 is supplied as a second multiplicand to the multiplier 10, to be multiplied by sample values of the input digital audio signal. In this way, the output of the processing chain 20 provides a gain control for the input digital audio signal.

The dynamics processing element 50 operates in the logarithmic domain, i.e. it receives envelope values and generates gain control values in decibels rather than as linear measures. This is so that the time constants, control values and other constants used by the dynamics processing element relate to a decibel law directly, which in turn makes the implementation of the dynamics processing element more simple and intuitive.

The dynamics processor of FIG. 1 may be arranged to provide various different dynamics processing functions, depending on the way in which the dynamics processing element 50 generates an output gain control value in response to the detected envelope of the input digital audio signal. For the present explanation, consider the simple example whereby the dynamics processing element is arranged as a threshold compressor to provide an output of "0 decibels" (no compression) when the detected input envelope is under, say, −20 dB and to provide an output indicative of, say, a 4:1 compression for higher detected input envelopes. (In general, the threshold level and the amount of applied compression will be selectable by the user under the control of the control circuit 60). This example compression response is illustrated schematically in FIG. 2 of the accompanying drawings.

The gain control value output by the dynamics processing element 50 is then converted to a linear control value by the logarithmic converter 70 and supplied as a multiplicand to the multiplier 10.

SUMMARY OF THE INVENTION

This invention provides digital audio processing apparatus comprising:
- means for detecting the magnitude of an input digital audio signal; and
- a variable gain element for applying a gain to the input digital audio signal dependent on the detected magnitude of the input digital audio signal, in which:
    - (i) the applied gain is linearly related to the envelope signal with a first predetermined slope, for detected magnitudes below a first threshold magnitude;
    - (ii) the applied gain is linearly related to the envelope signal with a second predetermined slope, for detected magnitudes above a second threshold magnitude higher than the first threshold magnitude; and
    - (iii) for detected magnitudes from the first threshold magnitude to the second threshold magnitude, the slope of the applied gain with respect to detected magnitude varies monotonically from the first predetermined slope to the second predetermined slope.

The invention recognises that the gain slope discontinuity (or "knee") at the onset of compression in the previously proposed compression processor described above can lead to subjectively disturbing audible distortion of the compressed signal.

The invention addresses this problem by providing a digital compression processor with a "soft knee"—that is, a range of levels over which the slope of the applied gain with respect to detected envelope magnitude monotonically increases (or decreases) from the first to the second slope values. This reduces the rate of change of gain slope with level (which is very high in a previously proposed system having an abrupt change of gain as shown in FIG. 2), which in turn reduces the audible distortion which the compressor applies to the digital audio signal.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
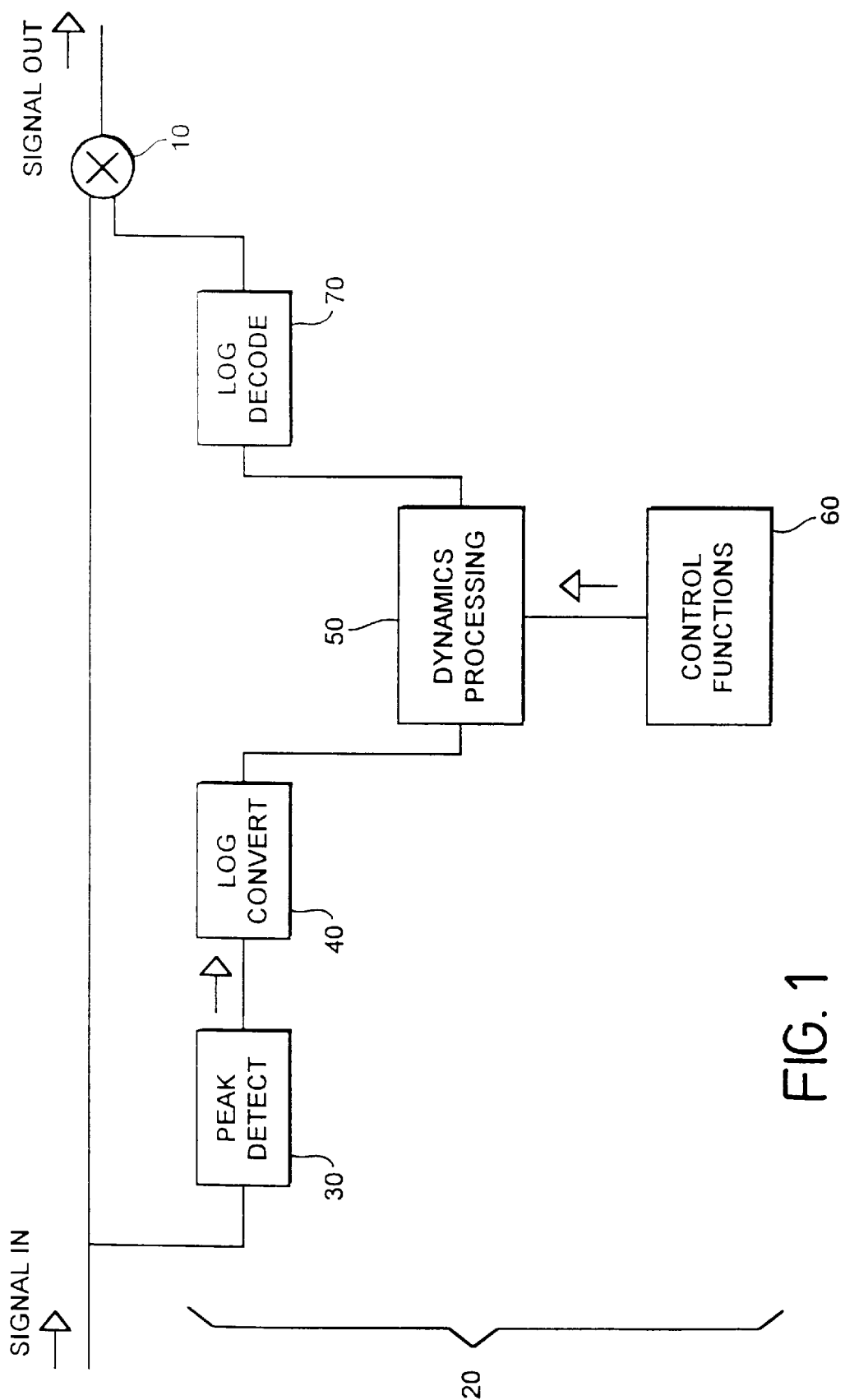
FIG. 1 is a schematic diagram of a dynamics processor.
Figure 2:
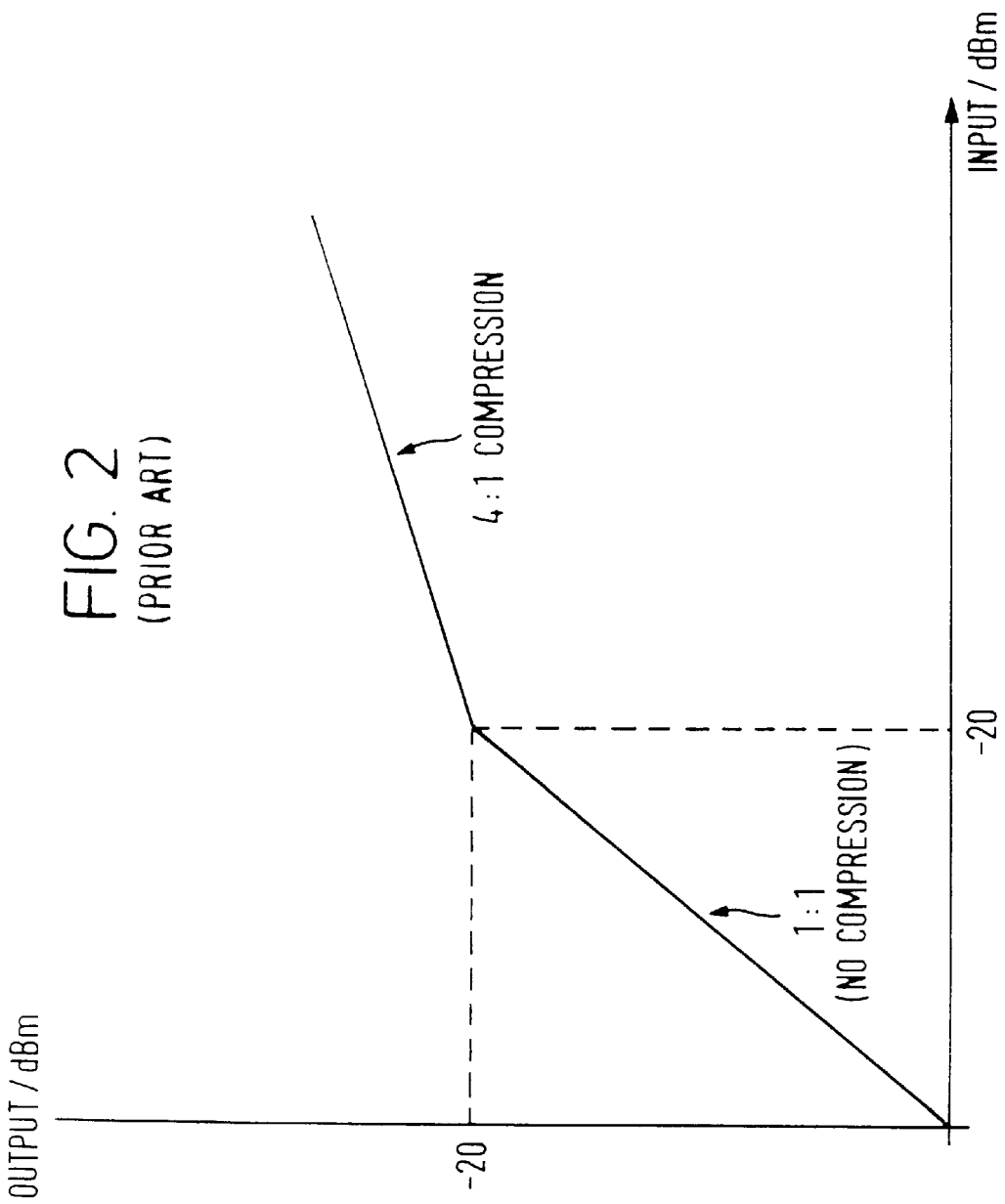
FIG. 2 is a schematic graph of a simple compression response of the processor of FIG. 1.

The so-called "soft knee" processing is carried out by a calculation performed by the dynamics processing element 50 of FIG. 1, in response to control parameters supplied by the control circuit 60.

In the following discussion, the level threshold above which the input digital signal is to be compressed is $L_{Thr}$; the input level is $L_{in}$; the excess level is $L_{ex}$; and a "soft knee" region is $e_s$. The quantity $(L_{in}-L_{Thr})$ is referred to as x.

Considering the relationship between $L_{ex}$ and x, which in a previously proposed compression processor (having a gain discontinuity at the onset of compression) obeys the relationship:

if x<0 then $L_{ex}=0$ if x>=0 then $L_{ex}=x$ In the present embodiment, this relationship is changed to introduce a new function F(x) when x is within the "soft knee" amount $e_s$ of zero. Thus, if $\quad x < -e_s \quad$ then $\quad L_{ex} = 0$ if $\quad -e_s <= x < e_s \quad$ then $\quad L_{ex} = F(x)$ if $\quad x >= e_s \quad$ then $\quad L_{ex} = x$ The function F(x) is selected so that the value of F(x) and the first derivative of F(x) (i.e. F'(x)) are continuous with the linear sections at values of x less than $-e_s$ and at values of x greater than or equal to $e_s$. Thus, the following conditions are applied:

$F(-e_s)=0$
$F'(-e_s)=0$
$F(e_s)=e_s$
$F'(e_s)=1$

Figure 3:
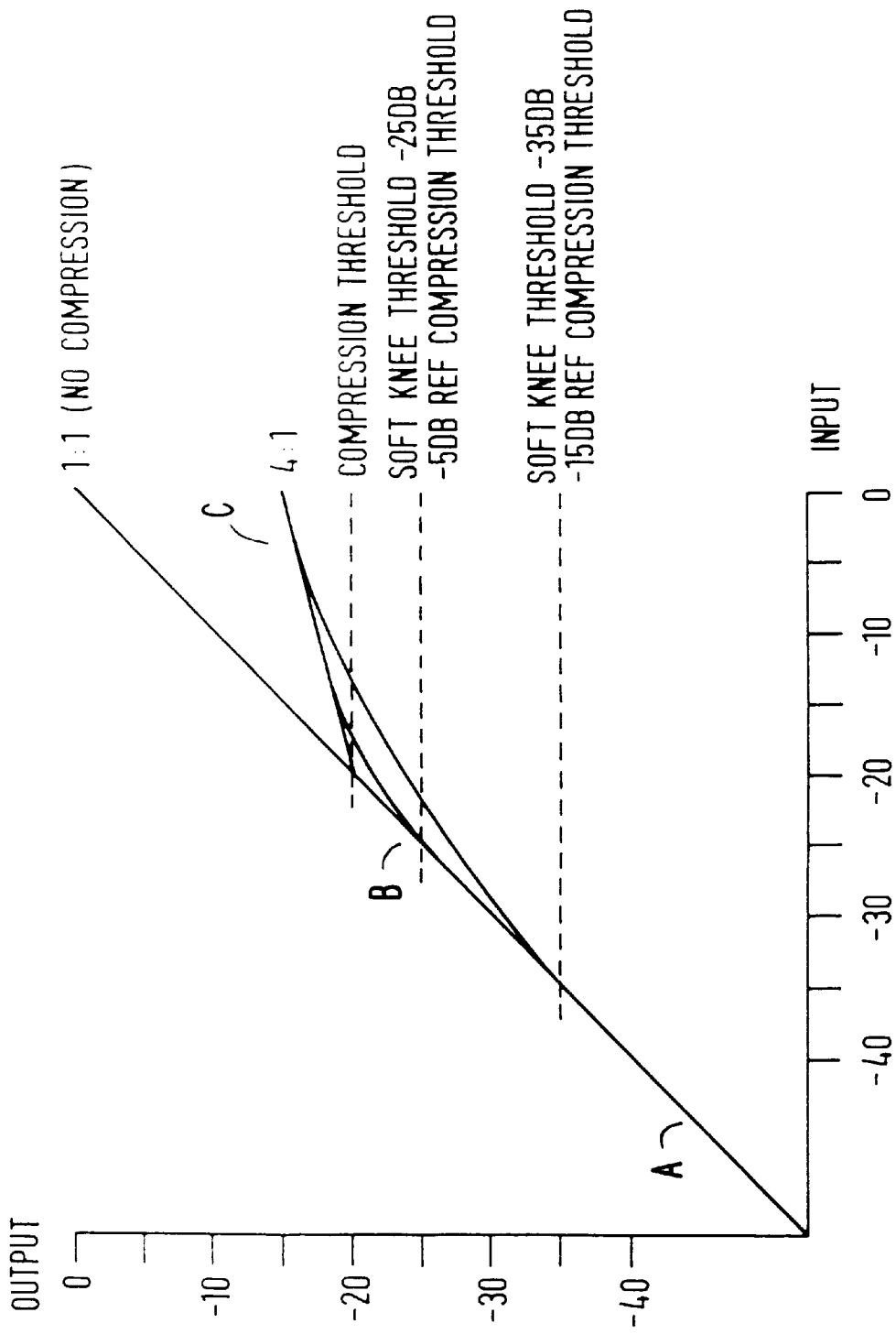
FIG. 3 is a schematic graph of a compression response provided by embodiments of the invention.

A large family of functions fit these conditions, but for convenience of implementation (i.e. calculation be the dynamics element 50), a low order (quadratic) polynomial is used:

if $\quad x < -e_s \quad$ then $\quad L_{ex} = 0$ if $\quad -e_s <= x < e_s \quad$ then $\quad L_{ex} = x^2/4e_s + x/2 + e_s/4$ if $\quad x >= e_s \quad$ then $\quad L_{ex} = x$ These relationships are illustrated schematically in areas A, B, and C, the graph of FIG. 3, for two values of $e_s$, 5 dB (the upper curve) and 15 dB (the lower curve).

Figure 4:
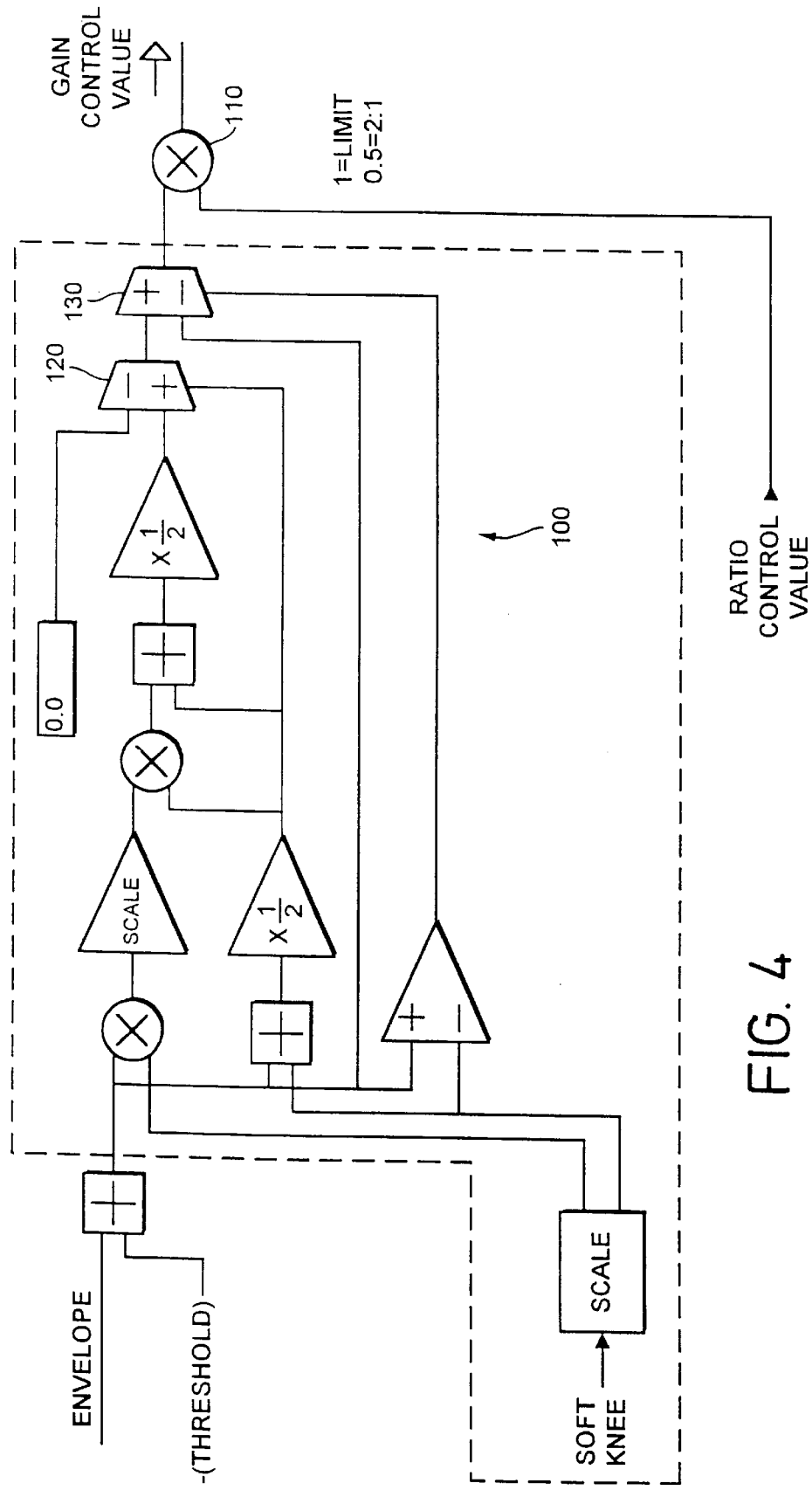
FIG. 4 is a schematic diagram of the circuitry of a dynamics processing element for generating the response of FIG. 3.

FIG. 4 is a schematic diagram of the circuitry of a dynamics processing element for generating this compression response.

The circuit of FIG. 4 receives an envelope value from the logarithmic converter 40, a threshold value (in fact a negative value), a "soft knee" value ($e_s$) and a ratio control value, all from the control circuit 60.

The threshold value is added to the envelope (in effect, subtracting the threshold from the envelope value) and the resulting value is passed, with the scaled soft knee value $e_s$, to a calculation circuit which performs the calculations described above.

The resulting quadratic expression from the calculating circuit is passed to a multiplier 110 where it is multiplied by the ratio control value to scale the response to the desired degree of compression (e.g. the ratio control value would be 0.25 for the 4:1 asymptotic compression shown in FIG. 3).

At the output of the calculating circuit are two multiplexers, 120, 130. If the value (envelope—threshold) is less than $-e_s$, then the multiplexer 120 passes a value of zero instead of the quadratic expression. If the value (envelope—threshold) is greater than $+e_s$, then the multiplexer 130 passes the (envelope—threshold) value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Digital audio processing apparatus comprising:

a magnitude detector for detecting the magnitude of an input digital audio signal; and a variable gain element for applying a gain to said input digital audio signal dependent on the detected magnitude of said input digital audio signal, in which:

(i) said applied gain is linearly related to an envelope signal with a first predetermined slope, for detected magnitudes below a first threshold magnitude;

(ii) said applied gain is linearly related to said envelope signal with a second predetermined slope, for detected magnitudes above a second threshold magnitude higher than said first threshold magnitude; and (iii) for detected magnitudes from said first threshold magnitude to said second threshold magnitude, a slope of said applied gain with respect to detected magnitude varies linearly with a third predetermined slope from said first predetermined slope to said second predetermined slope.

2. Apparatus according to claim 1, in which said second predetermined slope represents a higher degree of compression than said first predetermined slope.

3. Digital audio processing apparatus comprising:

a magnitude detector for detecting the magnitude of an input digital audio signal; and a variable gain element for applying a gain to said input digital audio signal dependent on the detected magnitude of said input digital audio signal, in which:

(i) said applied gain is linearly related to an envelope signal with a first predetermined slope, for detected magnitudes below a first threshold magnitude;

(ii) said applied gain is linearly related to said envelope signal with a second predetermined slope, for detected magnitudes above a second threshold magnitude higher than said first threshold magnitude; and (iii) for detected magnitudes from said first threshold magnitude to said second threshold magnitude, a slope of said applied gain with respect to detected magnitude varies non-linearly from said first predetermined slope to said second predetermined slope.

4. The digital audio processing apparatus according to claim 3, in which said second predetermined slope represents a higher degree of compression than said first predetermined slope.

5. The digital audio processing apparatus according to claim 3, in which the non-linearly varying slope of said applied gain varies in accordance with a quadratic polynomial function.

* * * * *